United States Patent [19]
Jones

[11] Patent Number: 5,167,673
[45] Date of Patent: Dec. 1, 1992

[54] TOOL INSERT

[76] Inventor: Barbara L. Jones, 80 Chisbury Close, Forest Park, Bracknell RG12 3TX, England

[21] Appl. No.: 731,708

[22] Filed: Jul. 16, 1991

[30] Foreign Application Priority Data

Jul. 16, 1990 [GB] United Kingdom ............... 9015609

[51] Int. Cl.⁵ .............................................. B24B 1/00
[52] U.S. Cl. ...................................... 51/295; 51/293; 51/298; 51/309
[58] Field of Search .................. 51/293, 295, 298, 309

[56] References Cited

U.S. PATENT DOCUMENTS

| | | | |
|---|---|---|---|
| 4,240,806 | 12/1980 | Frantzen | 51/295 |
| 4,332,751 | 6/1982 | Brassell et al. | 264/28 |
| 4,481,016 | 11/1984 | Campbell et al. | 51/293 |
| 4,544,517 | 10/1985 | Ohno | 51/295 |
| 4,681,600 | 7/1987 | Rhoades et al. | 51/293 |
| 4,682,987 | 7/1987 | Brady et al. | 51/295 |

FOREIGN PATENT DOCUMENTS

| | | |
|---|---|---|
| 0417924 | 3/1991 | European Pat. Off. |
| 63-267165 | 11/1988 | Japan |
| 1012529 | 12/1965 | United Kingdom |
| 1182630 | 2/1970 | United Kingdom |

Primary Examiner—William R. Dixon, Jr.
Assistant Examiner—Willie J. Thompson
Attorney, Agent, or Firm—Scully, Scott, Murphy & Presser

[57] ABSTRACT

A tool insert such as a nozzle is produced by providing a former depositing a diamond layer on at least a portion of a surface of the former, bonding a polymer-based support to a surface of the diamond layer and removing the former to expose a wear-resistant diamond surface. The top portion may be removed to produce a nozzle. The diamond layer is preferably a CVD diamond layer.

11 Claims, 1 Drawing Sheet

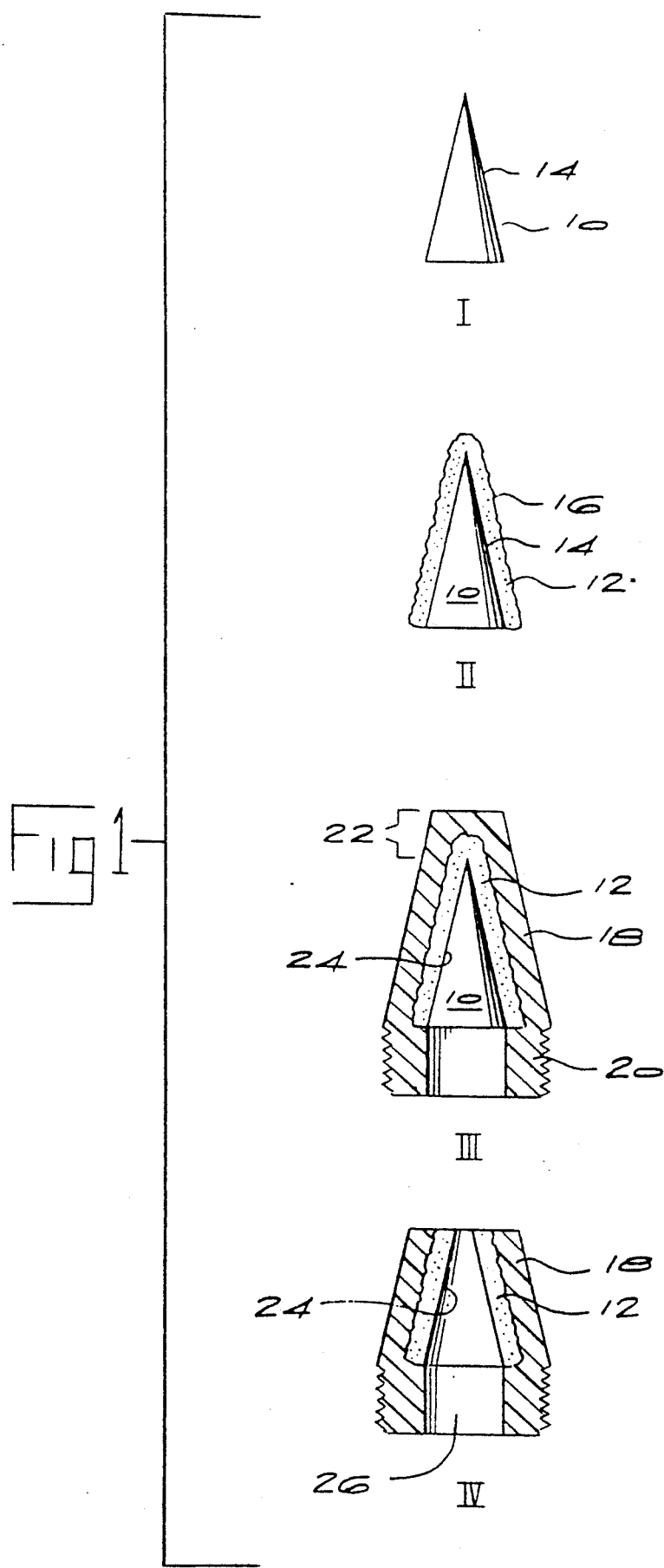

TOOL INSERT

BACKGROUND OF THE INVENTION

This invention relates to a tool insert and more particularly to such an insert which presents a wear-resistant surface.

There are many tool inserts in use commercially which present a wear-resistant surface. Examples of such inserts are nozzles and bearings. In the case of nozzles wear-resistant surfaces may be provided by cemented carbide or by a metal. Such surfaces tend to have short working lives when exposed to hostile and corrosive environments.

SUMMARY OF THE INVENTION

According to the present invention, there is provided a tool insert comprising a diamond layer presenting major surfaces on each of opposite sides thereof, the one major surface providing a wear-resistant surface for the insert and the other major surface being bonded to a polymer-based support which has sufficient strength to withstand the forces to which the tool insert is subjected in use.

Further according to the invention, a method of producing a tool insert as described above includes the steps of providing a suitable former, depositing a diamond layer on at least a portion of a surface of the former, bonding a polymer-based support as described above to a surface of the diamond layer, and removing the former to expose a wear-resistant surface on the layer.

DESCRIPTION OF THE DRAWINGS

The drawings illustrate schematically the various steps in the embodiment of the invention.

DESCRIPTION OF EMBODIMENT

The wear-resistant surface of the diamond layer is preferably shaped to define a passage which will typically be of closed configuration in section. Examples of suitable passages are cylindrical and conical passages. Examples of such tool inserts are nozzles.

The tool insert may also be a bearing.

The polymer will have sufficient strength to withstand the forces to which the tool insert is subjected during use. It will, therefore, vary according to the nature of the insert. The polymer may be a thermoplastic polymer of a thermosetting polymer. Generally, thermoplastic polymers are preferred.

The polymer may, for example, have the following characteristics:

| | |
|---|---|
| Density: | 0,90–1,23 g/cc |
| Heat capacity: | 1,916–2,100 kJ/kg/k |
| Tensile strength: | 12–200 N/mm² |
| Softening temperature | 88 to 155° C. |
| Rockwise hardness | 44–60 C Scale |
| Coefficient of Thermal Expansion | 5–710 ppm |

Examples of polymers which have these characteristics are polyethylene, polypropylene, polycarbonates, neoprene and polybutadiene. Such polymers are particularly useful for tool inserts which are nozzles.

Other examples of suitable thermoplastic polymers are polyether ether ketone, polyether ketone, polyaryl ether ketone, poly (amide-imide), and polyphenylene sulphide.

The polymer may be strengthened by including or embedding therein fibres or powders. These powders may be metallic or ceramic in nature and a particularly suitable example is graphite powder or fibre. An example of suitable metal particles are copper particles. Typically the powder or fibre will be provided in an amount of up to 40% by mass of the polymer.

An example of a suitable polymer is a high performance poly (amide-imide) resin such as that sold under the trade name Torlon. A particularly suitable resin of this type is that numbered 7130 which contains 30% by mass of graphite fibre and 1% by mass fluorocarbon.

The diamond layer may be produced or deposited on the former by methods known in the art such as chemical vapour deposition (CVD) and ion implantation (also known as ion beam deposition). The preferred method is CVD which produces a CVD diamond layer on the former.

CVD involves the synthesis of diamond from the gas phase. The process generally involves providing a mixture of hydrogen or oxygen gas and a suitable gaseous carbon compound such as a hydrocarbon, applying sufficient energy to that gas to dissociate the hydrogen or oxygen into atomic hydrogen or oxygen and the gas into active carbon ions, atoms or CH radicals and allowing such active species to deposit on a substrate to form diamond. Dissociation of the gases can take place by a variety of methods.

One such method is the use of a hot filament. In this method, the gas temperature at the filament is about 2000° C. and the substrate on which diamond growth occurs is at 800° to 1100° C.

A second commonly used method is a plasma assisted method. The hydrogen or oxygen and gaseous carbon compound are excited into a reaction state in a plasma region. The energy of excitation may be microwave, RF or DC plasma, or UV light or heat. The substrate is heated by the plasma.

The former will be made of a material which is suitable to allow a diamond layer to be produced thereon using the particular method chosen. Examples of suitable materials, particularly for CVD, are silicon, titanium, hafnium, tantalum, molybdenum and carbides and nitrides thereof.

The former may be removed from the diamond layer by methods such as etching, machining and milling.

An embodiment of the invention will now be described with reference to the accompanying drawings. Referring to these drawings, in a first step a silicon former in the shape of a cone 10 is provided. In step II the cone 10 has a layer of diamond 12 deposited over the entire sloping side surface 14 using any known chemical vapour deposition method. The diamond layer 12 will have a rough outer surface 16. The diamond-coated cone of step II is then placed in a suitable mould and a polymer support 18 produced around the cone (step III). The moulded polymer support 18 has a threaded portion 20. In the final step IV, the silicon cone 10 is removed, for example by etching, and the top section 22 of the unit produced in step III removed, for example by milling, to produce a polymer-based pre-threaded nozzle with a diamond lining. The inner surface 24 provides a highly abrasive resistant surface for the passage 26 of the nozzle. The surface 24 has a fine finish replicating that of cone 10 and not a rough finish of a normal CVD diamond film or layer.

I claim:

1. A tool insert comprising a diamond layer presenting major surfaces on opposite sides thereof, the one major surface providing a wear-resistant surface for the insert and the other major surface being bonded to a polymer-based support which has sufficient strength to withstand the forces to which the tool insert is subjected in use.

2. A tool insert according to claim 1 wherein the wear-resistant surface of the diamond layer is shaped to define a passage.

3. A tool insert according to claim 2 wherein the wear-resistant surface of the diamond layer is shaped to define a passage of closed configuration in section.

4. A tool insert according to claim 3 wherein the passage is a cylindrical or a conical passage.

5. A tool insert according to claim 1 wherein the diamond layer is a CVD diamond layer.

6. A tool insert according to claim 1 wherein the polymer has the following characteristics:

| | |
|---|---|
| Density: | 0,90–1,23 g/cc |
| Heat capacity: | 1,916–2,100 kJ/kg/k |
| Tensile strength: | 12–200 N/mm$^2$ |
| Softening temperature | 88 to 155° C. |
| Rockwise hardness | 44–60 C Scale |
| Coefficient of Thermal Expansion | 5–710 ppm |

7. A tool insert according to claim 6 wherein the polymer is selected from polyethylene and polypropylene.

8. A tool insert according to claim 1 wherein the polymer is selected from polyether ether ketone, polyether ketone, polyaryl ether ketone, poly (amide-imide) and polyphenylene sulphide.

9. A tool insert according to claim 1 which is a nozzle.

10. A process of producing a tool insert according to claim 1 which includes the steps of providing a suitable former, depositing a diamond layer on at least a portion of a surface of the former, bonding a polymer-based support to a surface of the diamond layer and removing the former to expose a wear-resistant diamond surface.

11. A process according to claim 10 wherein the former is made of a material selected from silicon, titanium, hafnium, tantalum, molybdenum and carbides and nitrides thereof.

* * * * *

UNITED STATES PATENT AND TRADEMARK OFFICE
CERTIFICATE OF CORRECTION

PATENT NO. : 5,167,673
DATED : December 1, 1992
INVENTOR(S) : Barbara Lynn Jones It is certified that error appears in the above-identified patent and that said Letters Patent is hereby corrected as shown below:

Column 1, line 36: "The drawings illustrate" should read as --Figure 1 illustrates--

Column 1, line 50: "of" should read as --or--

Column 2, lines 50-51: delete "the accompanying drawings. Referring to these drawings" and insert --Figure 1 which illustrates the steps of this embodiment. The steps are identified therein as I, II, III and IV. Referring to Figure 1--

Signed and Sealed this

Twenty-eighth Day of December, 1993

Attest:

BRUCE LEHMAN

Attesting Officer

Commissioner of Patents and Trademarks